United States Patent
Kim et al.

(10) Patent No.: US 8,503,220 B2
(45) Date of Patent: Aug. 6, 2013

(54) SEMICONDUCTOR DEVICE AND METHOD OF SENSING DATA OF THE SEMICONDUCTOR DEVICE

(75) Inventors: Ho-jung Kim, Suwon-si (KR);
Jai-kwang Shin, Anyang-si (KR);
Hyun-sik Choi, Hwaseong-si (KR);
Hyung-su Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 132 days.

(21) Appl. No.: 13/233,304

(22) Filed: Sep. 15, 2011

(65) Prior Publication Data
US 2012/0140545 A1 Jun. 7, 2012

(30) Foreign Application Priority Data
Dec. 7, 2010 (KR) .......................... 10-2010-0124234

(51) Int. Cl.
*G11C 11/00* (2006.01)
(52) U.S. Cl.
USPC ................ 365/148; 365/189.011; 365/189.06
(58) Field of Classification Search
USPC .............. 365/148, 158, 163, 189.06, 189.09, 365/189.17, 210.12, 211
See application file for complete search history.

(56) References Cited

U.S. PATENT DOCUMENTS

| | | | | |
|---|---|---|---|---|
| 6,055,188 A | * | 4/2000 | Takeuchi et al. | 365/185.22 |
| 7,542,338 B2 | | 6/2009 | Scheuerlein et al. | |
| 7,561,484 B2 | | 7/2009 | Achter | |
| 7,663,910 B2 | * | 2/2010 | Kang et al. | 365/163 |
| 7,764,533 B2 | | 7/2010 | Breitwisch et al. | |
| 8,320,171 B2 | * | 11/2012 | Park | 365/163 |
| 2002/0080644 A1 | * | 6/2002 | Ito | 365/158 |
| 2008/0291715 A1 | * | 11/2008 | Park et al. | 365/148 |
| 2011/0063891 A1 | * | 3/2011 | Kajigaya | 365/149 |

FOREIGN PATENT DOCUMENTS

| KR | 20080017277 A | 2/2008 |
|---|---|---|
| KR | 20100080348 A | 7/2010 |

* cited by examiner

*Primary Examiner* — Gene Auduong
(74) *Attorney, Agent, or Firm* — Harness, Dickey & Pierce, P.L.C.

(57) ABSTRACT

In one example embodiment, the semiconductor device includes a memory cell array having at least one memory cell disposed in a region at which at least one bit line and at least one word line cross. A sensing unit senses data stored in the at least one memory cell. The sensing unit includes a connection control unit configured to control a connection between the at least one bit line and a sensing line based on a control signal, the control signal having a voltage level that varies based on a value of data being sensed by the sensing unit.

27 Claims, 11 Drawing Sheets

SEMICONDUCTOR DEVICE AND METHOD OF SENSING DATA OF THE SEMICONDUCTOR DEVICE

CROSS-REFERENCE TO RELATED APPLICATIONS

This application claims the benefit of Korean Patent Application No. 10-2010-0124234, filed on Dec. 7, 2010, in the Korean Intellectual Property Office (KIPO), the entire contents of which are incorporated herein by reference.

BACKGROUND

1. Field

The present disclosure relates to a semiconductor device, and more particularly, to a semiconductor device capable of storing data and a method of sensing data stored in the semiconductor device.

2. Description of the Related Art

According to a demand for a memory device to have high storage capacity and low power consumption, research has been conducted to provide next-generation memory devices that are non-volatile and do not perform a refresh operation. It is desirable for the next-generation memory devices to have a high integration of a Dynamic Random Access Memory (DRAM), a non-volatile feature of a flash memory, a high speed of a Static RAM (SRAM), or the like. Examples of the next-generation memory devices that are in the limelight are phase change RAM (PRAM), nano floating gate memory (NFGM), polymer RAM (PoRAM), magnetic RAM (MRAM), ferroelectric RAM (FeRAM), resistive RAM (RRAM), or the like.

SUMMARY

Some example embodiments provide semiconductor devices capable of efficiently sensing data stored in a memory cell without separately arranging a reference cell, and/or a method of sensing data of the semiconductor devices.

Additional aspects will be set forth in part in the description which follows and, in part, will be apparent from the description, or may be learned by practice of the presented embodiments.

According to an example embodiment, a semiconductor device includes a memory cell array comprising at least one memory cell disposed in a region at which at least one bit line and at least one word line cross; and a sensing unit configured to sense data stored in the at least one memory cell. The sensing unit includes a connection control unit configured to control a connection between the at least one bit line and a sensing line based on a control signal, the control signal having a voltage level that varies based on a value of data being sensed by the sensing unit.

According to an example embodiment the sensing unit may further include a and a sense amplifying unit configured to generate a sense result based on a voltage of the sensing line and a reference voltage.

The sensing unit may further include a precharging unit configured to precharges the sensing line to a first precharge voltage according to a precharge enable signal.

The semiconductor device may be configured such that the control signal may have a first voltage level in a precharge period in which the precharge enable signal is activated, and may have a second voltage level less than the first voltage level in a develop period in which a develop enable signal is activated.

The at least one memory cell may be a multi-level cell (MLC) capable of storing multi-level data, and the semiconductor device may be configured such that the second voltage level corresponds to a level of data to be sensed from among the multi-level data.

The at least one memory cell may be a multi-level resistive memory cell capable of storing multi-level data respectively corresponding to a plurality of resistance levels, and the semiconductor device may be configured such that the second voltage level is proportional to a resistance level of data to be sensed from among the multi-level data.

The connection control unit may include a clamping unit that is connected between the at least one bit line and the sensing line, and the clamping unit is configured to clamp the at least one bit line to a constant voltage level according to the control signal. The clamping unit may include a switching device that is configured to be activated in response to the control signal, thereby connecting the at least one bit line and the sensing line.

The connection control unit may be configured to connect the at least one bit line and the sensing line in the precharge period, and the at least one bit line may be precharged to a second precharge voltage corresponding to a difference between the first voltage level and a threshold voltage of the switching device.

The connection control unit is configured to connect the at least one bit line and the sensing line if the voltage level of the at least one bit line is less than a difference between the second voltage level and the threshold voltage of the switching device in the develop period. The sensing unit may be configured such that if the at least one bit line and the sensing line are connected, a voltage level of the sensing line may be decreased to the voltage level of the at least one bit line, and the sense amplifying unit may sense the at least one memory cell as an ON cell.

The connection control may be configured such that, if the voltage level of the at least one bit line is greater than a difference between the second voltage level and the threshold voltage of the switching device in the develop period, the connection control unit does not connect the at least one bit line and the sensing line. The sensing unit may be configured such that if the at least one bit line and the sensing line are not connected, a voltage level of the sensing line may be maintained at the first precharge voltage, and the sense amplifying unit may sense the at least one memory cell as an OFF cell.

The connection control unit may further include at least two discharge devices each connected to terminals of the switching device, and the two discharge devices are configured to discharge a voltage of the at least one bit line and the voltage of the sensing line in a discharge period in which a discharge enable signal is activated.

The connection control unit may further include a temperature sensing unit sensing a temperature variation of a surrounding temperature of the semiconductor device; and a control signal providing unit configured to adjust a voltage level of the control signal according to the sensed temperature variation so as to compensate for the a variation of a threshold voltage of the switching device according to the variation of the surrounding temperature, and configured to provide the switching device with the control signal having the adjusted voltage level.

The semiconductor device may be configured to sense data stored in the at least one memory cell without using a reference current provided by a reference cell.

According to an example embodiment, a method of sensing data stored in at least one memory cell in a semiconductor device including the at least one memory cell disposed in a region at which at least one bit line and at least one word line, the method includes the operation of controlling connection between the at least one bit line and a sensing based on a control signal, the control signal having a voltage level that varies based on a value of data being sensed by the sensing unit. According to an example embodiment, the method may further include precharging the at least one bit line according to a precharge enable signal; and generating a sensing result based on a voltage of the sensing line and a reference voltage.

The control signal may have a first voltage level in a precharge period in which the precharge enable signal is activated, and may have a second voltage level less than the first voltage level in a develop period in which a develop enable signal is activated.

The at least one memory cell may be a multi-level cell (MLC) capable of storing multi-level data, and the second voltage level corresponds to a level of data to be sensed from among the multi-level data.

The operation of precharging the at least one bit line may include the operations of precharging the sensing line to a first precharge voltage according to the precharge enable signal; and precharging the at least one bit line to a second precharge voltage by connecting the sensing line and the at least one bit line, wherein the second precharge voltage corresponds to a difference between the first voltage level and a threshold voltage.

The operation of controlling the connection may include the operation of connecting the at least one bit line and the sensing line if the voltage level of the at least one bit line is less than a difference between the second voltage level and a threshold voltage in the develop period. If the at least one bit line and the sensing line are connected, a voltage level of the sensing line may be decreased to the voltage level of the at least one bit line, and the at least one memory cell may be sensed as an ON cell.

The operation of controlling the connection may include the operation of preventing the connection of the at least one bit line and the sensing line if the voltage level of the at least one bit line is greater than a difference between the second voltage level and a threshold voltage in the develop period. If the at least one bit line and the sensing line are not connected, a voltage level of the sensing line may not be decreased to the voltage level of the at least one bit line, and the at least one memory cell may be sensed as an OFF cell.

The method may further include the operation of discharging a voltage of the at least one bit line and the voltage of the sensing line in a discharge period in which a discharge enable signal is activated.

The method may further include the operations of sensing a temperature variation of the semiconductor device; and adjusting a voltage level of the control signal according to the sensed temperature variation, and providing the control signal having the adjusted voltage level.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
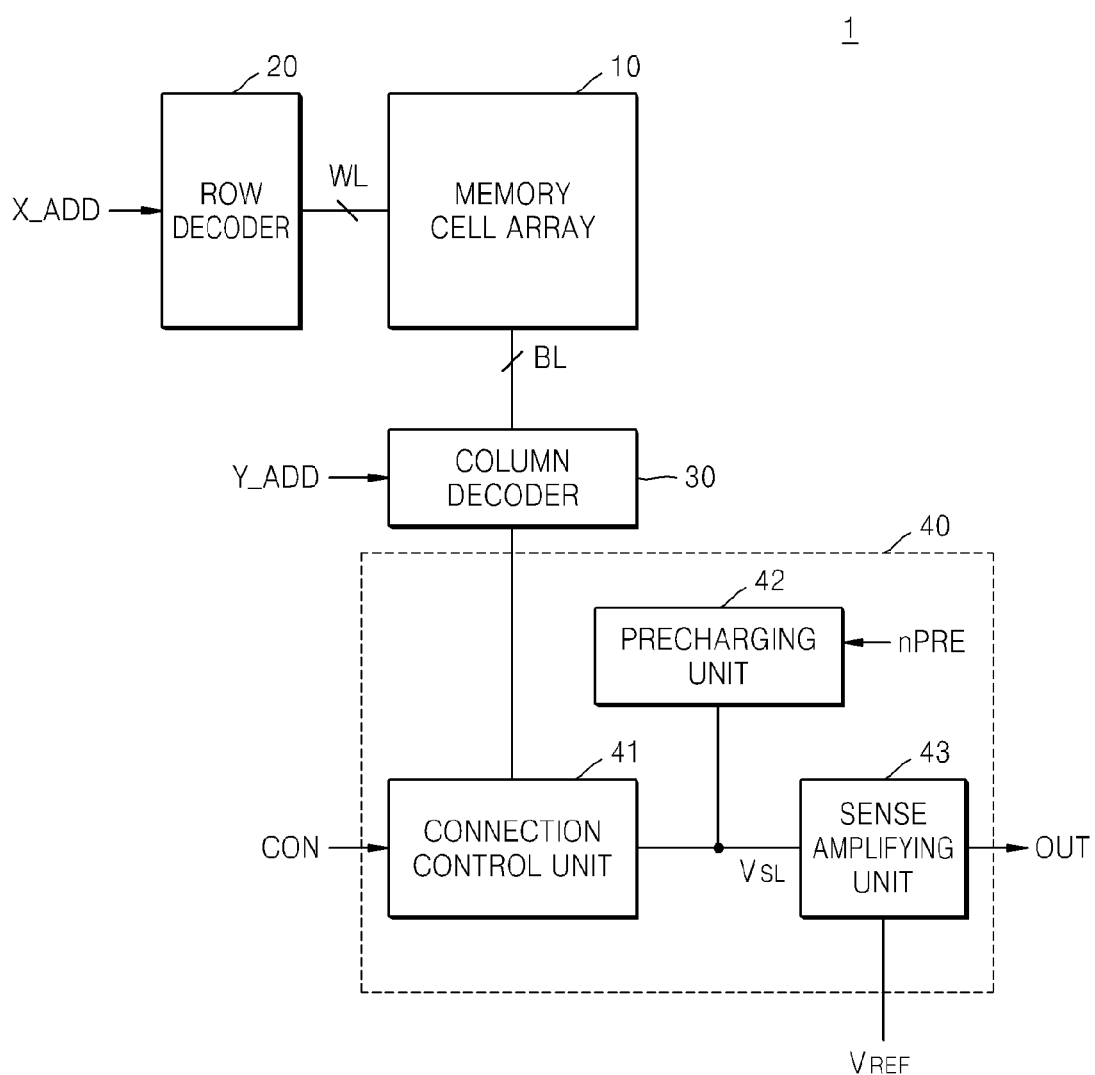
FIG. 1 is a block diagram of a semiconductor device according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a semiconductor device 1 according to an example embodiment.

Referring to FIG. 1, the semiconductor device 1 may include a memory cell array 10, a row decoder 20, a column decoder 30, and a sensing unit 40. The sensing unit 40 may include a connection control unit 41, a precharging unit 42, and a sense amplifying unit 43. In the present embodiment, the semiconductor device 1 may be a non-volatile memory device capable of storing predetermined or reference data.

The memory cell array 10 may include a plurality of memory blocks. Each of the plurality of memory blocks may include a plurality of non-volatile memory cells. The non-volatile memory cells may be disposed respectively in regions at which a plurality of word lines WL and a plurality of bit lines BL cross. Here, the non-volatile memory cells may be resistive memory cells including resistive random access memory (RRAM), phase-change RAM (PRAM) or the like, nano floating gate memory (NFGM), polymer RAM (PoRAM), magnetic RAM (MRAM), ferroelectric RAM (FeRAM), resistive RAM (RRAM), or flash memory cells.

The row decoder 20 may decode a row address X_ADD and then may activate a corresponding word line WL. The column decoder 30 may decode a column address Y_ADD and then may activate a corresponding bit line BL. The sensing unit 40 may sense data stored in each of the non-volatile memory cells, according to a signal output from the column decoder 30, that is, according to a voltage level $V_{BL}$ of a bit line BL activated by the column decoder 30. Hereinafter, the aforementioned components included in the sensing unit 40 will be described in detail.

The connection control unit 41 may control connection between the bit line BL and a sensing line according to a control signal CON having a variable voltage level and the voltage level $V_{BL}$ of the bit line BL output from the column decoder 30. In more detail, when a difference between a voltage level $V_{CON}$ of the control signal CON and the voltage level $V_{BL}$ of the bit line BL is greater than a predetermined or reference value, the connection control unit 41 may connect the bit line BL and the sensing line.

Here, the sensing line may be connected between at least one bit line BL or at least one global bit line GBL (not shown) and the sense amplifying unit 43. The sensing line may be referred to as a small bit line or a sensing bit line. A length of the sensing line may be significantly shorter than a length of at least one bit line BL or at least one global bit line GBL, so that a capacitance of the sensing line may be significantly smaller than a capacitance of at least one bit line BL or at least one global bit line GBL. Thus, the sense amplifying unit 43 may rapidly sense data stored in a memory cell by sensing a voltage level $V_{SL}$ of the sensing line, instead of at least one bit line BL or at least one global bit line GBL, so that a data sensing speed may be increased.

The precharging unit 42 may precharge the sensing line to a first precharge voltage $V_{PRE1}$ according to a precharge enable signal nPRE. When the sensing line is precharged to the first precharge voltage $V_{PRE1}$, the bit line BL connected to the sensing line may be precharged to a second precharge voltage $V_{PRE2}$. A level of the second precharge voltage $V_{PRE2}$ may be less than a level of the first precharge voltage $V_{PRE1}$.

The sense amplifying unit 43 may compare the voltage level $V_{SL}$ of the sensing line with a reference voltage $V_{REF}$, and then may sense data stored in a memory cell corresponding to the bit line BL connected to the sensing line. In an embodiment, the sensing unit 40 may further include a reference voltage generating unit (not shown), and the sense amplifying unit 43 may receive a reference voltage $V_{REF}$ generated by the reference voltage generating unit. In another embodiment, the sense amplifying unit 43 may receive a reference voltage $V_{REF}$ from an external source.

Figure 2:
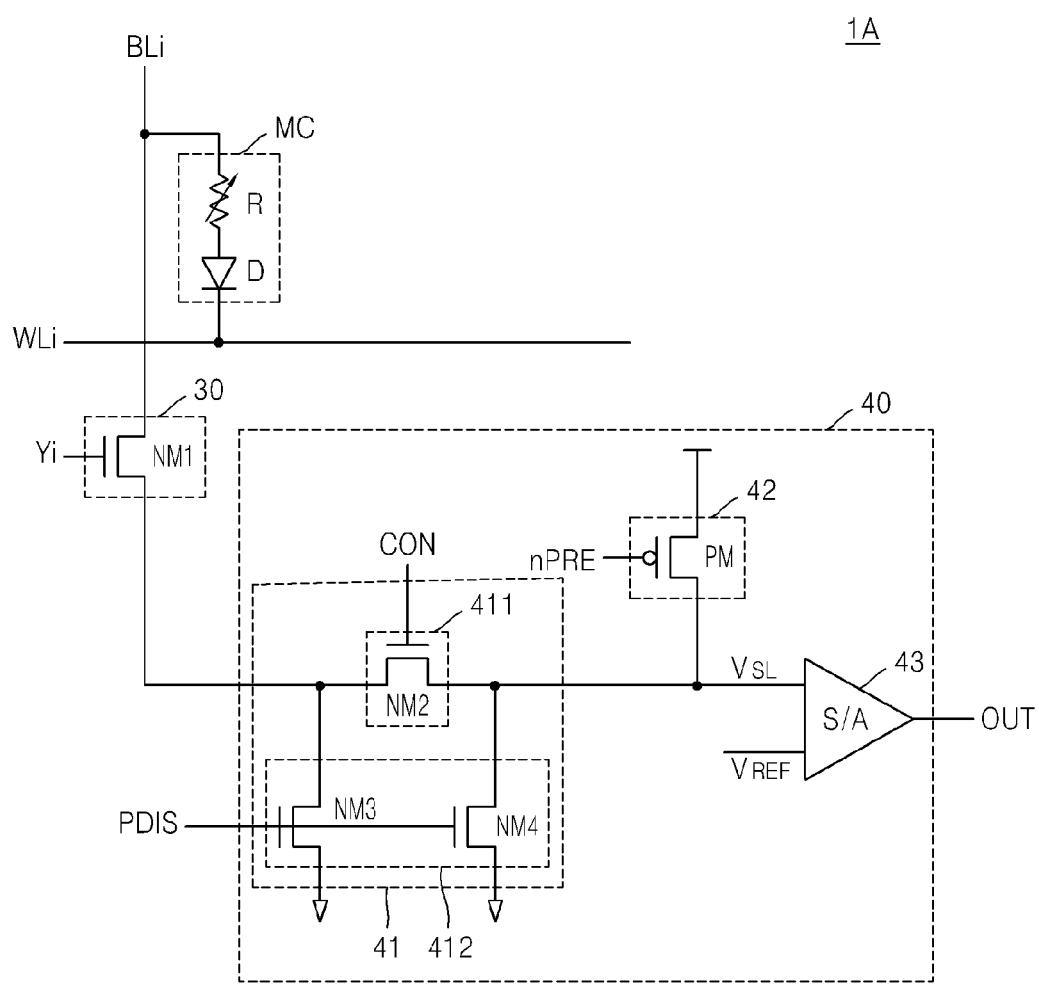
FIG. 2 is a circuit diagram illustrating a portion of a semiconductor device that is an example of the semiconductor device in FIG. 1.

FIG. 2 is a circuit diagram illustrating a portion of a semiconductor device 1A that is an example of the semiconductor device 1 in FIG. 1.

Referring to FIG. 2, the semiconductor device 1A may include at least one memory cell MC, a column decoder 30, and a sensing unit 40. For convenience of description, only one memory cell MC included in the memory cell array 10 of FIG. 1 is illustrated in FIG. 2, but other memory cells MC included in the memory cell array 10 of FIG. 1 may be embodied to have a similar configuration to that of the one memory cell MC. Also, the column decoder 30 and the sensing unit 40 may be connected to each of a plurality of bit lines BLi included in the memory cell array 10 of FIG. 1.

The at least one memory cell MC may be a resistive memory cell including a selection device D and a variable resistor R of which a resistance may vary in response to a voltage applied thereto. However, the at least one memory cell MC is not limited to the resistive memory cell and thus may be a NFGM cell, a PoRAM cell, a MRAM cell, a FeRAM cell, a flash memory cell, or the like.

A terminal of the variable resistor R may be connected to a bit line BLi, and the other terminal of the variable resistor R may be connected to the selection device D. A terminal of the selection device D may be connected to the other terminal of the variable resistor R, and the other terminal of the selection device D may be connected to a word line WLi. Here, the selection device D may be formed as a diode but is not limited thereto, and may be formed as a switching device including a transistor.

The column decoder 30 may include a switching device that is turned on or off in response to a column address Yi. In the present embodiment, the switching device may be formed as a first n-type metal oxide semiconductor (nMOS) transistor NM1 having a gate to which the column address Yi is applied. The first nMOS transistor NM1 may be turned on when the column address Yi is enabled, so that the bit line BLi connected to the first nMOS transistor NM1 may be activated. Thus, the column decoder 30 may provide a voltage level $V_{BL}$ of the bit line BLi to the sensing unit 40.

A connection control unit 41 may include a clamping unit 411 and a discharge unit 412.

The clamping unit 411 may clamp the voltage level $V_{BL}$ of the bit line BLi to a constant voltage level according to a control signal CON having a variable voltage level. In more detail, the clamping unit 411 may include a switching device that is turned on or off in response to the control signal CON. In the present embodiment, the switching device may be formed as a second nMOS transistor NM2 having a gate to which the control signal CON is applied. When the control signal CON is enabled, the second nMOS transistor NM2 may be turned on so that the second nMOS transistor NM2 may connect the bit line BLi and a sensing line that are connected to terminals of the second nMOS transistor NM2. The control signal CON may be provided, for example, by a control signal providing unit (not illustrated) included in the semiconductor device 1A.

The discharge unit 412 may include a plurality of discharge devices that are turned on or off in response to a discharge enable signal PDIS. In the present embodiment, the plurality of discharge devices may be formed as third and fourth nMOS transistors NM3 and NM4 having gates to which the discharge enable signal PDIS is applied. Here, sources of the third and fourth nMOS transistors NM3 and NM4 may be connected to a ground voltage terminal, and drains of the third and fourth nMOS transistors NM3 and NM4 may be respectively connected to a drain and a source of the second nMOS transistor NM2. When the discharge enable signal PDIS is activated, the third and fourth nMOS transistors NM3 and NM4 may be turned on so that the third and fourth nMOS transistors NM3 and NM4 may discharge the bit line BLi and the sensing line to a ground voltage level.

A precharging unit 42 may precharge a voltage level $V_{SL}$ of the sensing line to a first precharge voltage $V_{PRE1}$ according to a precharge enable signal nPRE. In more detail, the precharging unit 42 may include a switching device that is turned on or off in response to the precharge enable signal nPRE. In the present embodiment, the switching device may be formed as a pMOS transistor PM having a gate to which the precharge enable signal nPRE is applied. Here, a source of the pMOS transistor PM may be connected to a terminal of the first precharge voltage $V_{PRE1}$, and a drain of the pMOS transistor PM may be connected to the sensing line. When the precharge enable signal nPRE is enabled, the pMOS transistor PM may be turned on so that the voltage level $V_{SL}$ of the sensing line may be precharged to the first precharge voltage $V_{PRE1}$.

A sense amplifying unit 43 may compare the voltage level $V_{SL}$ of the sensing line with a reference voltage $V_{REF}$, and then may sense data stored in a memory cell MC based on the comparison. A configuration of the sense amplifying unit 43 is obvious to one of ordinary skill in the art.

Figure 3:
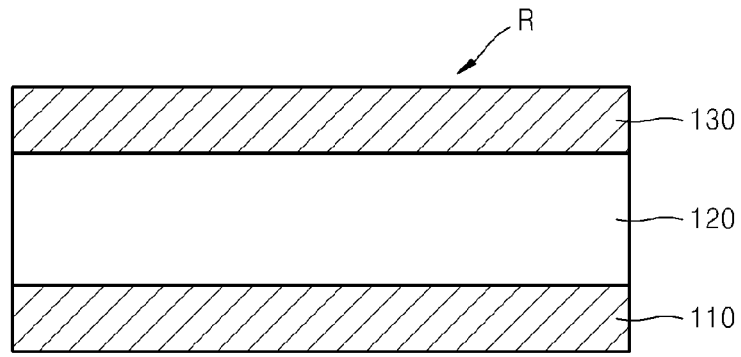
FIG. 3 is a cross-sectional view of a variable resistor included in a memory cell in the semiconductor device of FIG. 2.

FIG. 3 is a cross-sectional view of the variable resistor R included in the memory cell MC in the semiconductor device 1A of FIG. 2.

Referring to FIG. 3, the variable resistor R may include a lower electrode 110, a variable resistance material layer 120, and an upper electrode 130. The variable resistance material layer 120 may be formed between the lower electrode 110 and the upper electrode 130. In another embodiment, a variable resistor 100 may further include a buffer layer (not shown) on the lower electrode 110 or on the variable resistance material layer 120.

The lower electrode 110 and the upper electrode 130 may include a conductive material such as an oxidation resistant metal layer or a polysilicon layer. For example, the oxidation resistant metal layer may include at least one selected from among the group consisting of platinum (Pt), iridium (Ir), iridium oxide (IrO), titanium nitride (TiN), titanium aluminium nitride (TiAlN), tungsten (W), molybdenum (Mo), ruthenium (Ru), and ruthenium oxide (RuO), and may be formed after the buffer layer (not shown) is formed. In the present embodiment, the lower electrode 110 and the upper electrode 130 are respectively disposed on and below the variable resistance material layer 120 but the disposition of the lower electrode 110 and the upper electrode 130 is not limited thereto. In another embodiment, the lower electrode 110 and the upper electrode 130 may be respectively disposed at left and right sides of the variable resistance material layer 120.

The variable resistance material layer 120 may include Perovskite-based oxide or transition metal oxide. For example, the Perovskite-based oxide may include $Pr_{1-x}Ca_xMnO_3$, $La_{1-x}Ca_xMnO_3$, $SrZrO_3/SrTiO_3$, $CrTiO_3$, or $Pb(Zr, Ti)O_3/Zn_{1-x}Cd_xS$, and the transition metal oxide may include nickel (Ni), niobium (Nb), titanium (Ti), zirconium (Zr), hafnium (Hf), cobalt (Co), iron (Fe), copper (Cu), manganese (Mn), zinc (Zn), or chrome (Cr). A resistance of the variable resistance material layer 120 may vary in response to a voltage between the lower electrode 110 and the upper electrode 130.

Figure 4:
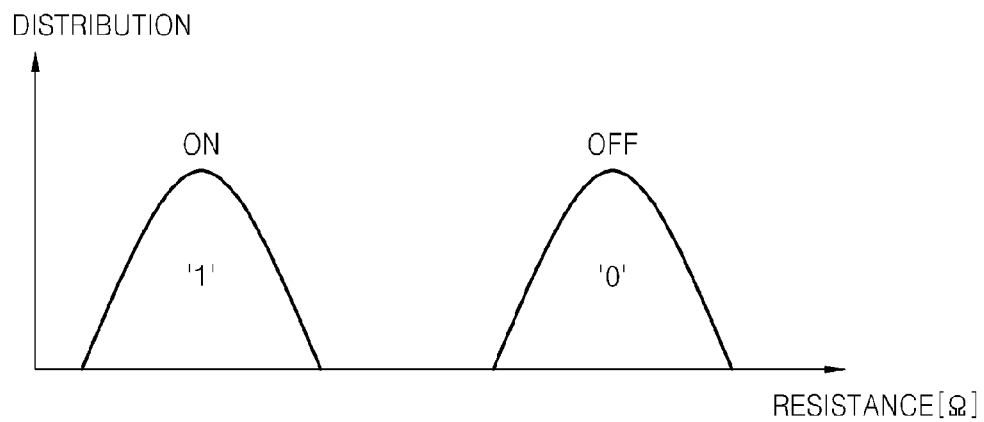
FIG. 4 is a graph illustrating resistance distribution of a variable resistor of FIG. 3 when the variable resistor is included in a single-bit memory device.

FIG. 4 is a graph illustrating resistance distribution of the variable resistor R of FIG. 3 when the variable resistor R is included in a single-bit memory device.

Referring to FIG. 4, an X-axis indicates a resistance of the single-bit memory device including the variable resistor R, and a Y-axis indicates the number of single bit memory cells. The variable resistor R of FIG. 3 may be used as a semiconductor device such as a single bit non-volatile memory device that stores data '0' or data '1' according to a resistance state of the variable resistance material layer 120.

In the present embodiment, it is assumed that data '1' corresponds to a low resistance state and data '0' corresponds to a high resistance state. An operation for writing data '1' to the variable resistor R may be referred to as a set operation, and an operation for writing data '0' to the variable resistor R may be referred to as a reset operation. However, the operations are not limited thereto. Thus, in another embodiment, it is assumed that data '1' corresponds to a high resistance state and data '0' corresponds to a low resistance state.

In a case where data '1' is written to a single bit non-volatile memory device, the single bit non-volatile memory device may correspond to an 'ON' state, and in a case where data '0' is written to the single bit non-volatile memory device, the single bit non-volatile memory device may correspond to an 'OFF' state. When the single bit non-volatile memory device is in the 'OFF' state, a resistance may have a significantly great value, e.g., the resistance may be greater than several MΩ.

As described above, when a resistance of a non-volatile memory device is great, a reference cell having a significantly great resistance is arranged in the semiconductor device 1A, and the resistance of the non-volatile memory device and the resistance of the reference cell are compared so that stored data may be sensed. Also, a reference cell providing a reference current is arranged in the semiconductor device 1A, and a current flowing in the non-volatile memory device and the reference current provided from the reference cell are compared so that stored data may be sensed. In a case where the reference cells are arranged in the semiconductor device 1A, problems are incurred since an area of the semiconductor device 1A increases and power consumption also increases.

Figure 5:
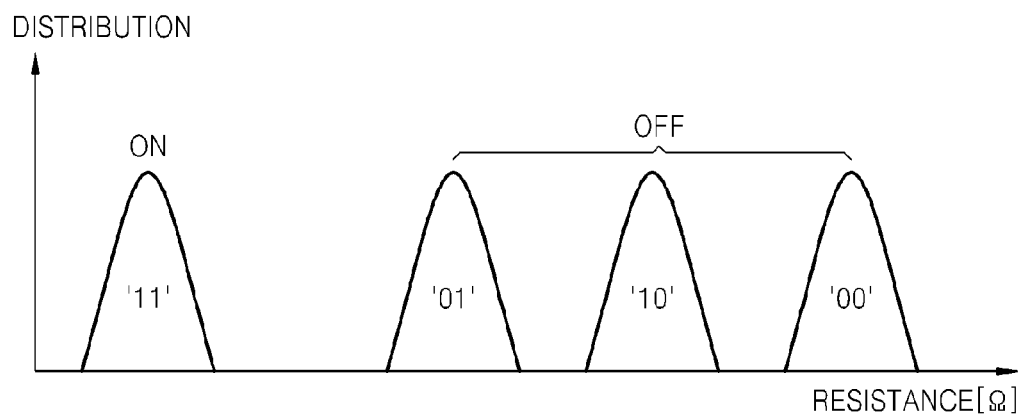
FIG. 5 is a graph illustrating resistance distribution of a variable resistor of FIG. 3 when the variable resistor is included in a multi-bit memory device.

FIG. 5 is a graph illustrating resistance distribution of the variable resistor R of FIG. 3 when the variable resistor R is included in a multi-bit memory device.

Referring to FIG. 5, an X-axis indicates a resistance of the multi-bit memory device including the variable resistor R, and a Y-axis indicates the number of multi-bit memory cells. The variable resistor R of FIG. 3 may be used as a semiconductor device such as a multi-bit non-volatile memory device that stores data '00', data '01', data '10', or data '11' according to a resistance state of the variable resistance material layer 120.

In the present embodiment, it is assumed that data '11' corresponds to a low resistance state and data '01', data '10', and data '00' correspond to a high resistance state. An operation for writing data '11' to the variable resistor R may be referred to as a set operation, and an operation for writing data '01', data '10', and data '00' to the variable resistor R may be referred to as a reset operation. However, the operations are not limited thereto. Thus, in another embodiment, it is assumed that data '11' corresponds to a high resistance state and data '01', data '10', and data '00' correspond to a low resistance state.

In a case where data '11' is written to a multi-bit non-volatile memory device, the multi-bit non-volatile memory device may correspond to an 'ON' state, and in a case where data '01', data '10', and data '00' are written to the multi-bit non-volatile memory device, the multi-bit non-volatile memory device may correspond to an 'OFF' state. When the multi-bit non-volatile memory device is in the 'OFF' state by having data '01', data '10' or data '00', a resistance may have a significantly great value, e.g., the resistance may be greater than several MΩ.

As described above, when a resistance of a non-volatile memory device is great, a reference cell having a significantly great resistance is arranged in the semiconductor device 1A, and the resistance of the non-volatile memory device and the resistance of the reference cell are compared so that stored data may be sensed. Also, a reference cell providing a reference current is arranged in the semiconductor device 1A, and a current flowing in the non-volatile memory device and the reference current provided from the reference cell are compared so that stored data may be sensed. In a case where the reference cells are arranged in the semiconductor device 1A, an area of the semiconductor device 1A may increase and power consumption may also increase.

Also, since the multi-bit non-volatile memory device may store multi-bit data, it may be desirable for the semiconductor device 1A to include a plurality of reference cells so as to separately sense data of each bit. In a case where the plurality of reference cells are arranged in the semiconductor device 1A, an area of the semiconductor device 1A may increase and power consumption may also increase.

The variable resistor R of FIG. 3 may be used as a semiconductor device such as a 3-bit non-volatile memory device that stores data '000', data '001', data '010', data '011', data '100', data '101', data '110', or data '111' according to a resistance state of the variable resistance material layer 120. Furthermore, the variable resistor R of FIG. 3 may be used as a semiconductor device such as a 4 or more multi-bit non-volatile memory device according to a resistance state of the variable resistance material layer 120.

Figure 6:
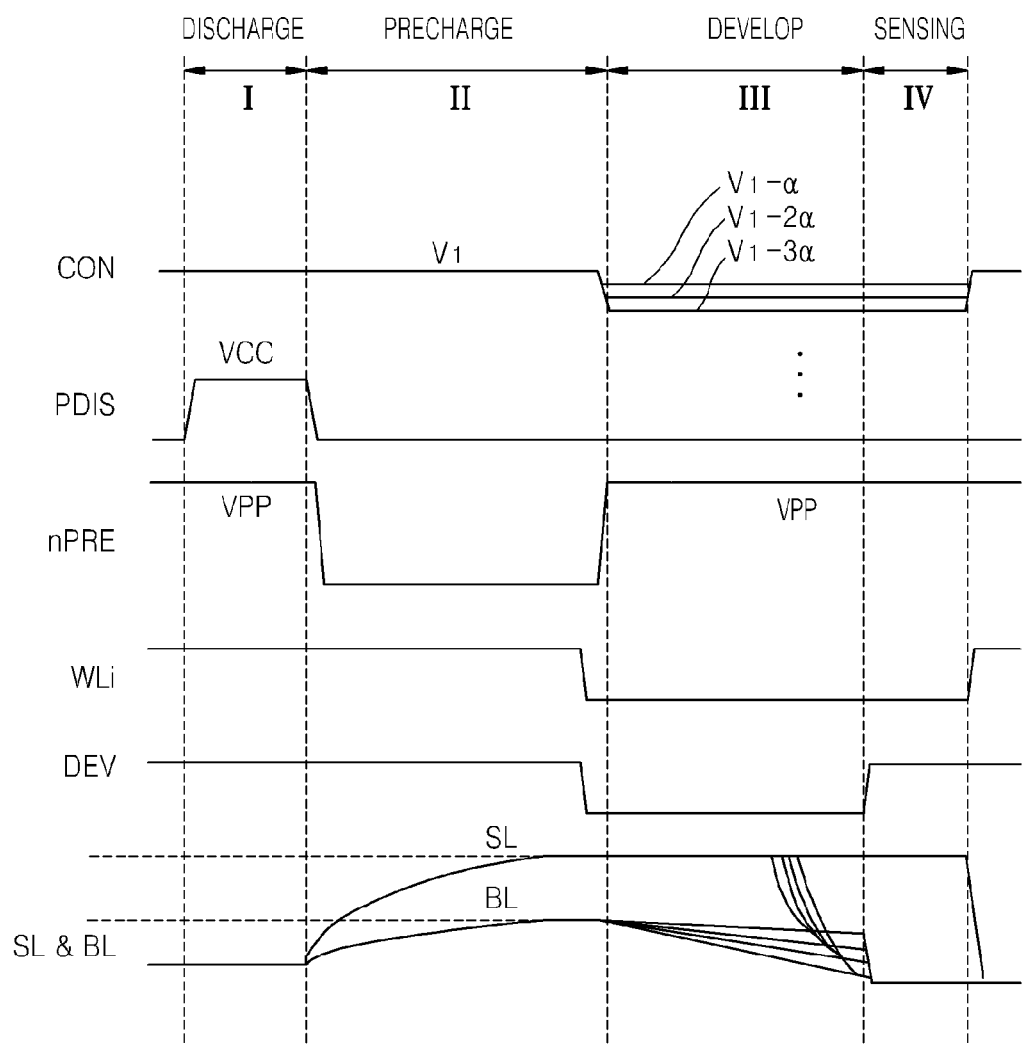
FIG. 6 is a timing diagram describing an operation of each component in the semiconductor device of FIG. 2.

FIG. 6 is a timing diagram describing an operation of each component in the semiconductor device 1A of FIG. 2.

Referring to FIG. 6, a period in which a discharge enable signal PDIS is activated is referred to as a discharge period I, and the discharge enable signal PDIS may be applied to gates of the third and fourth nMOS transistors NM3 and NM4 included in the discharge unit 412. A period in which a precharge enable signal nPRE is activated is referred to as a precharge period II, and the precharge enable signal nPRE may be applied to a gate of the pMOS transistor PM included in the precharging unit 42. A period in which a develop enable signal DEV is activated is referred to as a develop period III, and the develop enable signal DEV may be applied to the row decoder 20 or a row driver (not shown). A period in which the develop enable signal DEV is deactivated is referred to as a sensing period IV, which is after the develop period III.

In the discharge period I, the discharge enable signal PDIS may be activated and a voltage level VCC of the discharge enable signal PDIS may be logic 'high'. Here, the precharge enable signal nPRE may be deactivated and a voltage level VPP of the precharge enable signal nPRE may be logic 'high'. Also, at this time, the develop enable signal DEV may be deactivated and a voltage level of the develop enable signal DEV may be logic 'high'. Here, a voltage level $V_{CON}$ of a control signal CON may correspond to a first voltage level $V_1$, and a voltage level of a word line WLi may be logic 'high'.

Hereinafter, an operation of each component in the discharge period I will be described in detail. When the discharge enable signal PDIS is activated, the third and fourth nMOS transistors NM3 and NM4 included in the discharge unit 412 are turned on, and a bit line BLi and a sensing line SL are discharged so that voltage levels of the bit line BLi and the sensing line SL may correspond to a ground level.

In the precharge period II, the discharge enable signal PDIS may be deactivated and the voltage level VCC of the discharge enable signal PDIS may be logic 'low'. Here, the precharge enable signal nPRE may be activated and the voltage level VPP of the precharge enable signal nPRE may be logic 'low'. Also, at this time, the develop enable signal DEV may be deactivated and the voltage level of the develop enable signal DEV may be logic 'high'. Here, the voltage level $V_{CON}$ of the control signal CON may correspond to the first voltage level $V_1$, and the voltage level of the word line WLi may be logic 'high'.

Hereinafter, an operation of each component in the precharge period II will be described in detail. When the precharge enable signal nPRE is activated, the pMOS transistor PM included in the precharging unit 42 is turned on so that the voltage level of the sensing line SL may increase to a first precharge voltage $V_{PRE1}$. Here, the first precharge voltage $V_{PRE1}$ may correspond to a voltage level of a voltage terminal connected to a source of the pMOS transistor PM. Also, when the voltage level $V_{CON}$ of the control signal CON corresponds to the first voltage level $V_1$, the second nMOS transistor NM2 included in the clamping unit 411 is turned on so that the voltage level of the bit line BLi may increase to a second precharge voltage $V_{PRE2}$. Here, the second precharge voltage $V_{PRE2}$ may correspond to a difference (i.e., $V_1 - V_{TH}$) between the first voltage level $V_1$ and a threshold voltage $V_{TH}$ of the second nMOS transistor NM2.

In the develop period III, the discharge enable signal PDIS may be deactivated and the voltage level VCC of the discharge enable signal PDIS may be logic 'low'. Here, the precharge enable signal nPRE may be deactivated and the voltage level VPP of the precharge enable signal nPRE may be logic 'high'. Also, at this time, the develop enable signal DEV may be activated and the voltage level of the develop enable signal DEV may be logic 'low'. Here, the voltage level $V_{CON}$ of the control signal CON may correspond to a second voltage level $V_2$ that is decreased by a predetermined or reference critical value, compared to the first voltage level $V_1$, and the voltage level of the word line WLi may be logic 'low'.

Here, the second voltage level $V_2$ of the control signal CON may be changed according to a resistance level of data to be sensed. In an example, if a memory cell MC is a 2-bit memory cell, the second voltage level $V_2$ may be one of $V_1-\alpha$, $V_1-2\alpha$, and $V_1-3\alpha$, and in more detail, the higher the resistance level of data to be sensed is, the higher the second voltage level $V_2$ is. The value α, as used herein, is an offset voltage and may be an empirically determined design parameter. Thus, in the graph of FIG. 5, in a case where data '00' is to be sensed, the second voltage level $V_2$ may be $V_1-α$, in a case where data '10' is to be sensed, the second voltage level $V_2$ may be $V_1-2α$, and in a case where data '01' is to be sensed, the second voltage level $V_2$ may be $V_1-3α$. In another example, if a memory cell MC is a 3-bit memory cell, the second voltage level $V_2$ may be one of $V_1-α, V_1-2α, V_1-3α, V_1-4α, V_1-5α, V_1-6α$, and $V_1-7α$, and in this case, the higher the resistance level of data to be sensed is, the higher the second voltage level $V_2$ is.

Hereinafter, an operation of each component in the develop period III will be described in detail. The second voltage level $V_2$ of the control signal CON has the second voltage level $V_2$ and in the present embodiment, the second voltage level $V_2$, is referred to as $V_1-α$. When the control signal CON transits from the first voltage level $V_1$ to the second voltage level $V_2$ (i.e., $V_1-α$), a gate-source voltage ($Vgs=V_2-V_{BLi}=(V_1-α)-(V_1-V_{TH})$) of the second nMOS transistor NM2 is decreased to a voltage equal to or less than the threshold voltage $V_{TH}$ of the second nMOS transistor NM2, so that connection between the bit line BLi and the sensing line SL is disconnected. Thus, a voltage level $V_{BLi}$ of the bit line BLi may be slowly decreased according to data stored in a memory cell MC.

As the voltage level $V_{BLi}$ of the bit line BLi is decreased, when the gate-source voltage Vgs of the second nMOS transistor NM2 is equal to or greater than the threshold voltage $V_{TH}$ of the second nMOS transistor NM2, that is, in a case of $Vgs>V_{TH}$, the second nMOS transistor NM2 may be turned on so that the bit line BLi and the sensing line SL may be reconnected. In more detail, when the voltage level $V_{BLi}$ of the bit line BLi is greater than a difference between the second voltage level $V_2$ (i.e., $V_1-α$) of the control signal CON and the threshold voltage $V_{TH}$ of the second nMOS transistor NM2, that is, in a case of $V_{BLi}>V_1-α-V_{TH}$, the gate-source voltage Vgs is equal to or greater than the threshold voltage $V_{TH}$ of the second nMOS transistor NM2, so that the second nMOS transistor NM2 may be turned on.

Figure 7:
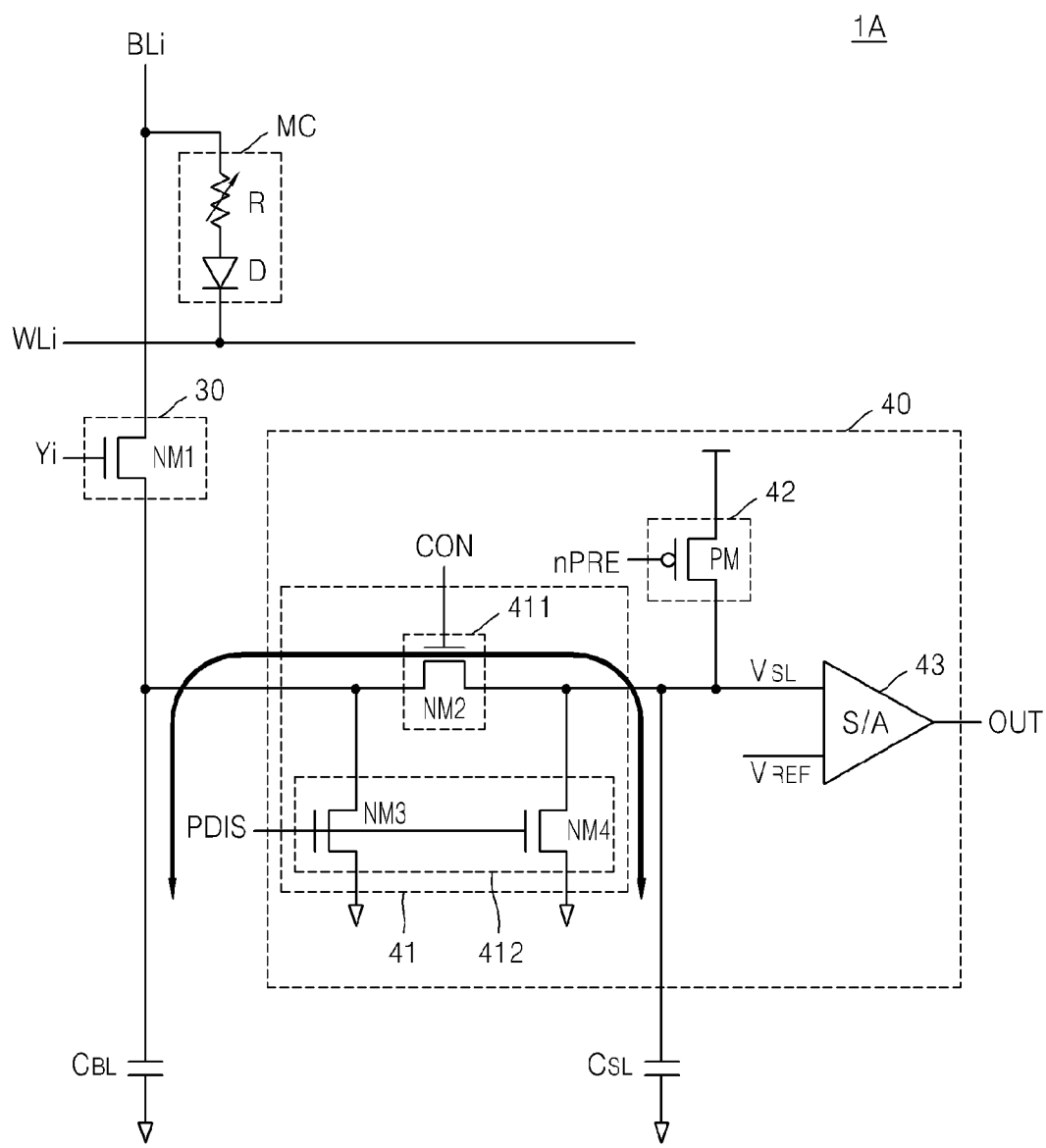
FIG. 7 is a modelled circuit diagram describing operations of the semiconductor device in a develop period.

FIG. 7 is a modelled circuit diagram describing operations of the semiconductor device 1A in a develop period III.

Referring to FIG. 7, a capacitance of a bit line BLi may be modelled as a first capacitor $C_{BL}$, and a capacitance of a sensing line SL may be modelled as a second capacitor $C_{SL}$. Here, a length of the bit line BLi may be significantly greater than a length of the sensing line SL so that a capacitance of the first capacitor $C_{BL}$ may be significantly greater than that of the second capacitor $C_{SL}$, for example, the first capacitor $C_{BL}$ may have a capacitance value that is about 10 times greater than a value of the second capacitor $C_{SL}$.

In the develop period III, when a voltage level $V_{BLi}$ of the bit line BLi is decreased so that the voltage level $V_{BLi}$ of the bit line BLi is greater than a difference between a second voltage level $V_2$ of a control signal CON and a threshold voltage $V_{TH}$ of a second nMOS transistor NM2, the second nMOS transistor NM2 is turned on, thus, charge sharing may be achieved between the bit line BLi and the sensing line SL. Thus, a voltage level $V_{SL}$ of the sensing line SL which is precharged to a first precharge voltage $V_{PRE1}$ in a precharge period II may be decreased to the voltage level $V_{BLi}$ of the bit line BLi. Here, a sense amplifying unit 43 may rapidly and easily sense data by comparing a reference voltage $V_{REF}$ with the voltage level $V_{SL}$ of the sensing line SL having the second capacitor $C_{SL}$ whose value is significantly less than the value of the first capacitor $C_{BL}$.

Referring back to FIG. 6, in the sensing period IV, the discharge enable signal PDIS may be deactivated and the voltage level VCC of the discharge enable signal PDIS may be logic 'low'. Here, the precharge enable signal nPRE may be deactivated and the voltage level VPP of the precharge enable signal nPRE may be logic 'high'. Also, at this time, the develop enable signal DEV may be deactivated and the voltage level of the develop enable signal DEV may be logic 'high'. Here, the voltage level $V_{CON}$ of the control signal CON may correspond to the second voltage level $V_2$ that is decreased by a predetermined or reference critical value, compared to the first voltage level $V_1$, and the voltage level of the word line WLi may be logic 'low'.

Hereinafter, an operation of each component in the sensing period IV will be described in detail. When the voltage level $V_{BLi}$ of the bit line BLi is decreased to a value equal to or less than a predetermined or reference value, the second nMOS transistor NM2 is turned on so that charge sharing is achieved between the bit line BLi and the sensing line SL, the voltage level $V_{SL}$ of the sensing line SL is decreased to the voltage level $V_{BLi}$ of the bit line BLi. Here, the sense amplifying unit 43 may compare the voltage level $V_{SL}$ of the sensing line SL with a reference voltage $V_{REF}$ and then may sense a memory cell MC as an ON cell. However, when the voltage level $V_{BLi}$ of the bit line BLi is not decreased to the value equal to or less than the predetermined or reference value, the second nMOS transistor NM2 is turned off, and there is no charge sharing between the bit line BLi and the sensing line SL, the voltage level $V_{SL}$ of the sensing line SL maintains the first precharge voltage $V_{PRE1}$. Here, the sense amplifying unit 43 may compare the voltage level $V_{SL}$ of the sensing line SL with the reference voltage $V_{REF}$ and then may sense the memory cell MC as an OFF cell.

In the present embodiment, since the second voltage level $V_2$ of the control signal CON in the develop period III is $V_1-α$, if the memory cell MC is sensed by the sense amplifying unit 43 as the ON cell, data stored in the memory cell MC may be one of '11', '01', and '10', and if the memory cell MC is sensed by the sense amplifying unit 43 as the OFF cell, data stored in the memory cell MC may be '00'. In another embodiment, when the second voltage level $V_2$ of the control signal CON in the develop period III is $V_1-2α$, if the memory cell MC is sensed by the sense amplifying unit 43 as the ON cell, data stored in the memory cell MC may be '11' or '01', and if the memory cell MC is sensed by the sense amplifying unit 43 as the OFF cell, data stored in the memory cell MC may be '10' or '00'. In another embodiment, when the second voltage level $V_2$ of the control signal CON in the develop period III is $V_1-3α$, if the memory cell MC is sensed by the sense amplifying unit 43 as the ON cell, data stored in the memory cell MC may be '11', and if the memory cell MC is sensed by the sense amplifying unit 43 as the OFF cell, data stored in the memory cell MC may be one of '01', '10', and '00'.

Figure 8:
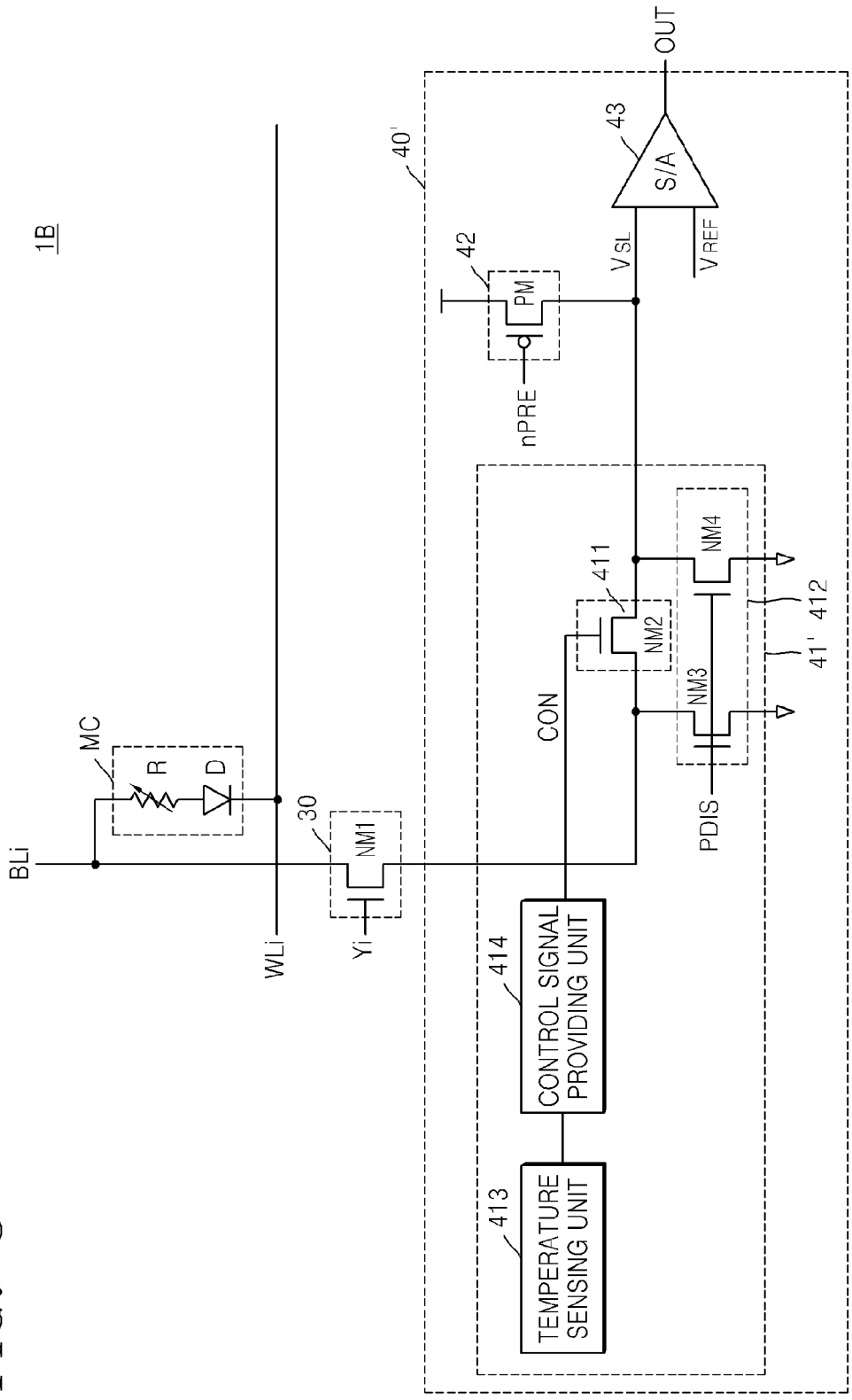
FIG. 8 is a circuit diagram illustrating a portion of a semiconductor device that is another example of the semiconductor device in FIG. 1.

FIG. 8 is a circuit diagram illustrating a portion of a semiconductor device 1B that is another example of the semiconductor device 1 in FIG. 1.

Referring to FIG. 8, the semiconductor device 1B may include at least one memory cell MC, a column decoder 30, and a sensing unit 40'. The sensing unit 40' may include a connection control unit 41', a precharging unit 42, and a sense amplifying unit 43. The semiconductor device 1B according to the present embodiment is substantially similar to the semiconductor device 1A of FIG. 2, except for a configuration of the sensing unit 40'. Thus, the contents described above with reference to FIG. 2 may equally apply to the at least one memory cell MC and the column decoder 30 according to the present embodiment.

The connection control unit 41' may include a clamping unit 411, a discharge unit 412, a temperature sensing unit 413, and a control signal providing unit 414. The clamping unit 411 and the discharge unit 412 according to the present embodiment may be substantially similar to the clamping unit 411 and the discharge unit 412 according to the previous embodiment of FIG. 2. Thus, the contents described above with reference to FIG. 2 may equally apply to the clamping unit 411 and the discharge unit 412 according to the present embodiment.

Threshold voltages of first through fourth nMOS transistors NM1, NM2, NM3, and NM4 included in the semiconductor device 1B may vary according to variation of a surrounding temperature. In more detail, when the surrounding temperature rises, the threshold voltages of first through fourth nMOS transistors NM1, NM2, NM3, and NM4 may decrease. In the present embodiment, data stored in the memory cell MC may be sensed by changing a voltage level $V_{CON}$ of a control signal CON applied to the second nMOS transistor NM2 included in the clamping unit 411, and by comparing the threshold voltage $V_{TH}$ of the second nMOS transistor NM2 with a difference between a voltage level $V_{BLi}$ of a bit line BLi and the voltage level $V_{CON}$ of the control signal CON. Thus, when the threshold voltage $V_{TH}$ of the second nMOS transistor NM2 is changed due to the variation of the surrounding temperature, the data stored in the memory cell MC may not be exactly sensed so that compensation for the variation of the surrounding temperature may be needed.

The temperature sensing unit 413 may sense temperature variation around the semiconductor device 1B. Examples of the temperature sensing unit 413 will be described in detail with reference to FIGS. 9 through 11. The control signal providing unit 414 may adjust a voltage level of the control signal CON according to the temperature variation sensed by the temperature sensing unit 413, and may provide the control signal CON having the adjusted voltage level to a gate of the second nMOS transistor NM2 included in the clamping unit 411.

Thus, although the threshold voltage $V_{TH}$ of the second nMOS transistor NM2 may change due to the temperature variation around the semiconductor device 1B, the control signal providing unit 414 may provide the second nMOS transistor NM2 with the control signal CON of which a voltage level is adjusted according to the temperature variation, so that the semiconductor device 1B may exactly sense the data stored in the memory cell MC.

Figure 9:
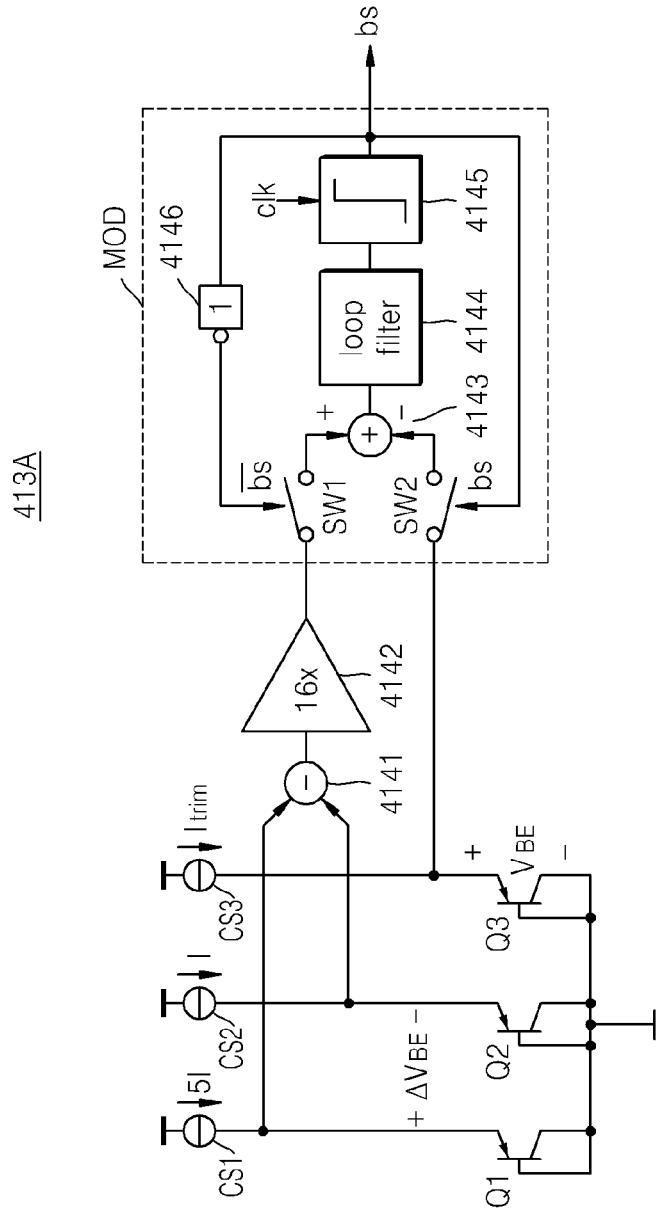
FIG. 9 is a circuit diagram illustrating an example of a temperature sensing unit included in the semiconductor device of FIG. 8.

FIG. 9 is a circuit diagram illustrating an example of the temperature sensing unit 413 included in the semiconductor device 1B of FIG. 8.

Referring to FIG. 9, a temperature sensing unit 413a may include first through third current sources CS1, CS2, and CS3, first through third transistors Q1, Q2, and Q3, a subtraction unit 4141, an amplification unit 4142, and a modification unit MOD. The sensing unit 413a may output a signal bs.

The first through third current sources CS1, CS2, and CS3 may provide current having a predetermined or reference level. For example, the first current source CS1 may provide a first current 51 which may be 5 times a current, I, provided by the second current source CS2. The third current source CS3 may provide a third current $I_{trim}$, which is a trim current for trimming the operation of the modification unit MOD and may be an empirically determined design parameter.

The first through third transistors Q1, Q2, and Q3 may be diode-connected, and the first through third transistors Q1, Q2, and Q3 may be respectively connected to the first through third current sources CS1, CS2, and CS3. Here, a voltage of terminals of the third transistor Q3 may be $V_{BE}$, a voltage between a collector of the first transistor Q1 and a collector of the second transistor Q2 may be $\Delta V_{BE}$. As the surrounding temperature of the semiconductor device 1B rises, $\Delta V_{BE}$ may be increased.

The subtraction unit 4141 may calculate a difference between a voltage of the collector of the first transistor Q1 and a voltage of the collector of the second transistor Q2. Thus, an output from the subtraction unit 4141 may correspond to $\Delta V_{BE}$. The amplification unit 4142 may amplify the output (i.e., $\Delta V_{BE}$) from the subtraction unit 4141. For example, the amplification unit 4142 may amplify the output (i.e., $\Delta V_{BE}$) from the subtraction unit 4141 by 16× times.

The modification unit MOD may perform sigma-delta modification, according to any known manner, on an output from the amplification unit 4142 and a collector voltage $V_{BE}$ of the third transistor Q3. In more detail, according to at least one example embodiment, the modification unit MOD may include first and second switches SW1 and SW2, an adder 4143, a loop filter 4144, a quantization unit 4145, and an inverter 4146, and detailed description for each component is omitted here.

Figure 10:
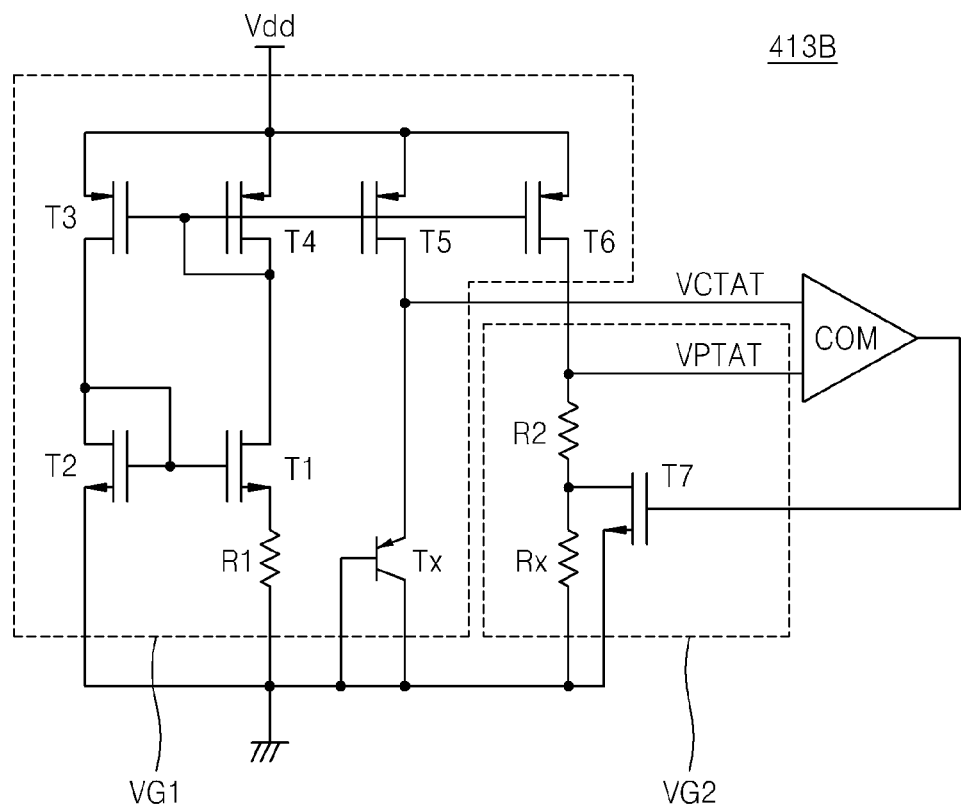
FIG. 10 is a circuit diagram illustrating another example of a temperature sensing unit included in the semiconductor device of FIG. 8.

FIG. 10 is a circuit diagram illustrating another example of the temperature sensing unit 413 included in the semiconductor device 1B of FIG. 8.

Referring to FIG. 10, a temperature sensing unit 413b may include first and second voltage providing units VG1 and VG2, and a comparison unit COM. The first voltage providing unit VG1 may include first through sixth transistors T1 through T6, a sensing transistor Tx, and a first resistor R1, and the second voltage providing unit VG2 may include second and third resistors R2 and Rx, and a seventh transistor T7.

The first voltage providing unit VG1 may provide a first voltage. The first voltage may be a complementary to absolute temperature (VCTAT) that is linearly inverse-proportional to an absolute temperature. The second voltage providing unit VG2 may provide a second voltage. The second voltage may be a proportional to absolute temperature (VPTAT) that is linearly proportional to the absolute temperature. The comparison unit COM may compare the first voltage VCTAT with the second voltage VPTAT, and may provide a comparison result to a gate of the seventh transistor T7.

When the surrounding temperature of the semiconductor device 1B falls, the first voltage VCTAT may be increased and the second voltage VPTAT may be decreased. At this time, the comparison unit COM may compare the first voltage VCTAT with the second voltage VPTAT and may provide an output of a logic 'high' level. When the surrounding temperature of the semiconductor device 1B rises, the first voltage VCTAT may be decreased and the second voltage VPTAT may be increased. At this time, the comparison unit COM may compare the first voltage VCTAT with the second voltage VPTAT and may provide an output of a logic 'low' level.

Figure 11:
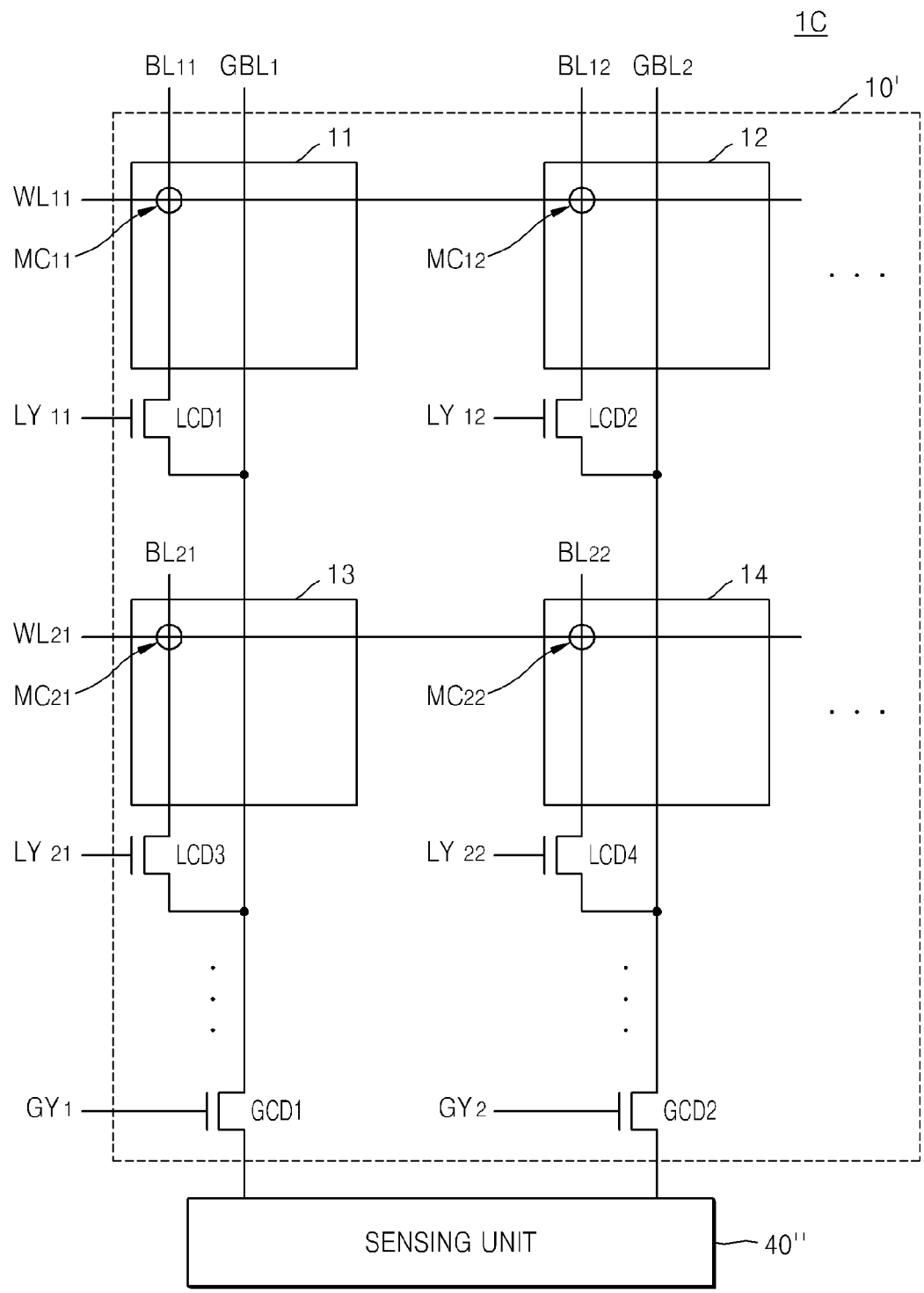
FIG. 11 is a circuit diagram illustrating a portion of a semiconductor device that is another example of the semiconductor device in FIG. 1.

FIG. 11 is a circuit diagram illustrating a portion of a semiconductor device 1C that is another example of the semiconductor device 1 in FIG. 1.

Referring to FIG. 11, the semiconductor device 1C may include a memory cell array 10' and a sensing unit 40". The contents described above with reference to the semiconductor device 1A of FIG. 2 and the contents described above with reference to the semiconductor device 1B of FIG. 8 may equally apply to the semiconductor device 1C according to the present embodiment. In particular, the sensing unit 40" may have a similar configuration to the sensing unit 40 of FIG. 2 or the sensing unit 40' of FIG. 8.

The memory cell array 10' may include first through fourth memory blocks 11, 12, 13, and 14, first through fourth local column decoders LCD1, LCD2, LCD3, and LCD4, and first and second global column decoders GCD1 and GCD2. Although four memory blocks are illustrated in FIG. 11, the memory cell array 10' may include four or more memory blocks. Also, although four local column decoders are illustrated in FIG. 11, the memory cell array 10' may include four or more local column decoders. Also, although two global column decoders are illustrated in FIG. 11, the memory cell array 10' may include two or more global column decoders.

The first memory block 11 may include a memory cell $MC_{11}$ disposed at a region where a word line $WL_{11}$ and a bit line $BL_{11}$ cross. Although not illustrated in FIG. 11, it is obvious to one of ordinary skill in the art that the first memory block 11 may include more memory cells. The first local column decoder LCD1 may be turned on when a first local column address $LY_{11}$ is activated, and then may connect the bit line $BL_{11}$ to a global bit line $GLB_1$.

The second memory block 12 may include a memory cell $MC_{12}$ disposed at a region where a word line $WL_{12}$ and a bit line $BL_{12}$ cross. Although not illustrated in FIG. 11, it is obvious to one of ordinary skill in the art that the second memory block 12 may include more memory cells. The second local column decoder LCD2 may be turned on when a second local column address $LY_{12}$ is activated, and then may connect the bit line $BL_{12}$ to a global bit line $GLB_2$.

The third memory block 13 may include a memory cell $MC_{21}$ disposed at a region where a word line $WL_{21}$ and a bit line $BL_{21}$ cross. Although not illustrated in FIG. 11, it is obvious to one of ordinary skill in the art that the third memory block 13 may include more memory cells. The third local column decoder LCD3 may be turned on when a third local column address $LY_{21}$ is activated, and then may connect the bit line $BL_{21}$ to the global bit line $GLB_1$.

The fourth memory block 14 may include a memory cell $MC_{22}$ disposed at a region where a word line $WL_{21}$ and a bit line $BL_{22}$ cross. Although not illustrated in FIG. 11, it is obvious to one of ordinary skill in the art that the fourth memory block 14 may include more memory cells. The fourth local column decoder LCD4 may be turned on when a fourth local column address $LY_{22}$ is activated, and then may connect the bit line $BL_{22}$ to the global bit line $GLB_2$.

When a first global column address $GY_1$ is activated, the bit lines $BL_{11}$ and $BL_{21}$ connected to the global bit line $GLB_1$ may be commonly connected to a sensing line included in the sensing unit 40', so that the sensing unit 40' may sense data stored in the memory cells $MC_{11}$ and $MC_{21}$ connected to the bit lines $BL_{11}$ and $BL_{21}$.

Similarly, when a second global column address $GY_2$ is activated, the bit lines $BL_{12}$ and $BL_{22}$ connected to the global bit line $GLB_2$ may be commonly connected to a sensing line included in the sensing unit 40', so that the sensing unit 40' may sense data stored in the memory cells $MC_{12}$ and $MC_{22}$ connected to the bit lines $BL_{12}$ and $BL_{22}$.

Figure 12:
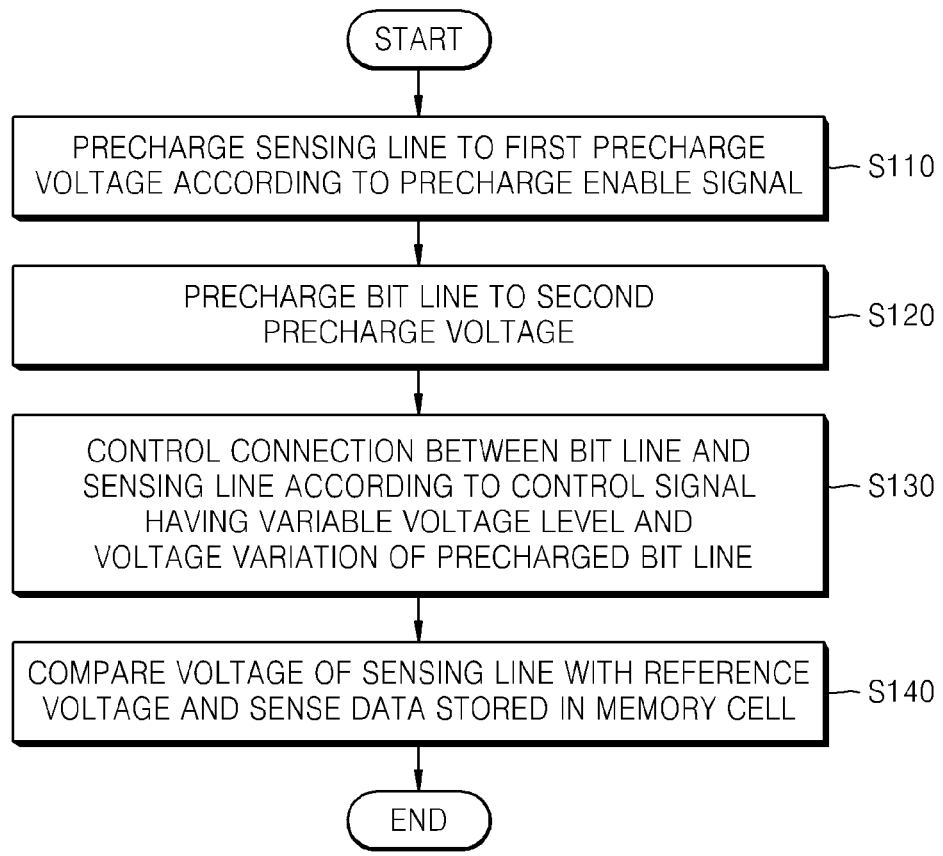
FIG. 12 is a flowchart of a method of sensing data of a semiconductor device, according to an example embodiment.

FIG. 12 is a flowchart of a method of sensing data of a semiconductor device, according to an example embodiment.

Referring to FIG. 12, the method of sensing data according to an example embodiment involves sensing data stored in the semiconductor devices shown in FIGS. 1 through 11. Thus, the contents described above with reference to FIGS. 1 through 11 may be applied to the method of sensing data according to the present embodiment.

In operation S110, a sensing line is precharged to a first precharge voltage according to a precharge enable signal.

In operation S120, the sensing line and a bit line are connected, so that the bit line is precharged to a second precharge voltage. Here, a level of the second precharge voltage may be less than a level of the first precharge voltage.

In operation S130, connection between the bit line and the sensing line is controlled according to a control signal having a variable voltage level, and a voltage variation of the precharged bit line. Here, the control signal may have a first voltage level in a precharge period in which the precharge enable signal is activated, and may have a second voltage level less than the first voltage level in a develop period in which a develop enable signal is activated.

In more detail, in the develop period in which the develop enable signal is activated, when a voltage level of the bit line is less than a difference between the second voltage level and a predetermined or reference threshold voltage, the bit line and the sensing line may be connected. However, when the voltage level of the bit line is greater than the difference between the second voltage level and the predetermined or reference threshold voltage in the develop period, the bit line and the sensing line may not be connected.

In operation S140, a voltage level of the sensing line is compared with a reference voltage, and then data stored in a memory cell is sensed. In more detail, when the bit line and the sensing line are connected, the voltage level of the sensing line may be decreased to the voltage level of the bit line, and the memory cell may be sensed as an ON cell. However, when the bit line and the sensing line are not connected, the voltage level of the sensing line may not be decreased to the voltage level of the bit line, and the memory cell may be sensed as an OFF cell.

In an example embodiment, the method of sensing data may further include an operation of discharging a voltage of the bit line and the sensing line in a discharge period. In another embodiment, the method of sensing data may further include operations of sensing a temperature variation around a semiconductor device, adjusting a voltage level of a control signal according to the sensed temperature variation, and providing a control signal of which a voltage level is adjusted.

Figure 13:
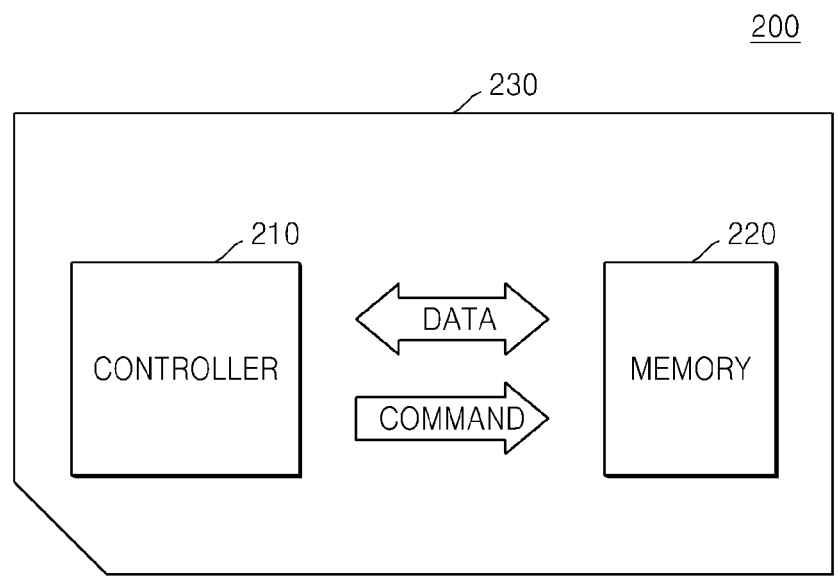
FIG. 13 is a schematic diagram of a memory card according to an example embodiment.

FIG. 13 is a schematic diagram of a memory card 200 according to an example embodiment.

Referring to FIG. 13, the memory card 200 may include a controller 210 and a memory 220 that are arranged to exchange an electrical signal. For example, when the controller 210 commands, the memory 220 may transmit data. The memory 220 may include a semiconductor device according to the one or more embodiments.

The memory card 200 may be used in various memory devices including a memory stick card, a smart media (SM) card, a secure digital (SD) card, a mini SD card, or a multi media card (MMC).

Figure 14:
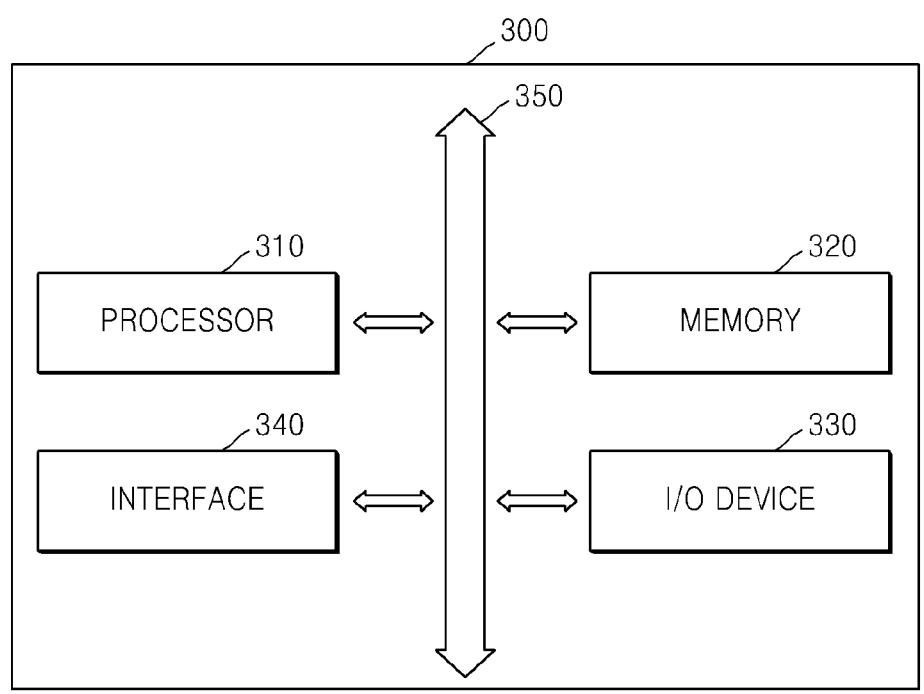
FIG. 14 is a block diagram of an electronic system according to an example embodiment.

FIG. 14 is a block diagram of an electronic system 300 according to an example embodiment.

Referring to FIG. 14, the electronic system 300 may include a processor 310, a memory 320, an input/output (I/O) device 330, and an interface 340. The electronic system 300 may be a mobile system or a system that transmits or receives information. The mobile system may be a personal digital assistant (PDA), a portable computer, a web tablet, a wireless phone, a mobile phone, a digital music player, or a memory card.

The processor 310 may function to execute a program and to control the electronic system 300. Here, the processor 310 may be a microprocessor, a digital signal processor, a microcontroller, or the like.

The I/O device 330 may be used in input or output of data of the electronic system 300. The electronic system 300 may be connected to an external device including a personal computer (PC) or a network by using the I/O device 330, and may exchange data with the external device. Here, the I/O device 330 may be a keypad, a keyboard, or a display.

The memory 320 may store code and/or data for an operation of the processor 310, and/or may store data processed by the processor 310. Here, the memory 320 may include a semiconductor device according to the one or more embodiments.

The interface 340 may be a data transmission path between the electronic system 300 and the external device. The processor 310, the memory 320, the I/O device 330, and the interface 340 may communicate with each other via a bus 350.

For example, the electronic system 300 may be used in a mobile phone, an MPEG-1 Audio Layer-3 (MP3) player, a navigation device, a portable multimedia player (PMP), a solid state drive (SSD), or household appliances.

According to the one or more embodiments, it is possible to sense data stored in a semiconductor device by controlling a connection between a bit line and a sensing line in response to a control signal having a variable voltage level according to data to be sensed, and a voltage level of the bit line according to data stored in a memory cell. Thus, it is may not be necessary for the semiconductor device to include a separate reference cell, so that an area and power consumption of the semiconductor device may be decreased. In particular, it is may not be necessary for a multi-level memory cell to include a plurality of reference cells, an area and power consumption of the semiconductor device may be further decreased.

In addition, according to the one or more embodiments, data stored in a memory cell may be sensed in a manner that a voltage of a sensing line having a small capacitance is compared with a reference voltage, instead of a bit line having a large capacitance, so that a data sensing speed may be increased.

It should be understood that the exemplary embodiments described therein should be considered in a descriptive sense only and not for purposes of limitation. Descriptions of features or aspects within each embodiment should typically be considered as available for other similar features or aspects in other embodiments.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device comprising:
   a memory cell array including at least one memory cell disposed in a region at which at least one bit line and at least one word line cross; and
   a sensing unit configured to sense data stored in the at least one memory cell, the sensing unit including a connection control unit configured to control a connection between the at least one bit line and a sensing line based on a control signal, the control signal having a voltage level that varies based on a value of data being sensed by the sensing unit.

2. The semiconductor deice of claim 1, wherein the sensing unit further includes
   a sense amplifying unit configured to generate a sense result based on a voltage of the sensing line and a reference voltage.

3. The semiconductor device of claim 2, wherein the sensing unit further includes a precharging unit configured to precharge the sensing line to a first precharge voltage according to a precharge enable signal.

4. The semiconductor device of claim 3, wherein the semiconductor device is configured such that the control signal has a first voltage level in a precharge period in which the precharge enable signal is activated, and has a second voltage level less than the first voltage level in a develop period in which a develop enable signal is activated.

5. The semiconductor device of claim 4, wherein the at least one memory cell is a multi-level cell (MLC) capable of storing multi-level data, and
   wherein the semiconductor device is configured such that the second voltage level corresponds to a level of data to be sensed from among the multi-level data.

6. The semiconductor device of claim 4, wherein the at least one memory cell is a multi-level resistive memory cell capable of storing multi-level data respectively corresponding to a plurality of resistance levels, and
   wherein the semiconductor device is configured such that the second voltage level is proportional to a resistance level of data to be sensed from among the multi-level data.

7. The semiconductor device of claim 4, wherein the connection control unit includes a clamping unit that is connected between the at least one bit line and the sensing line, and the clamping unit is configured to clamp the at least one bit line to a constant voltage level according to the control signal.

8. The semiconductor device of claim 7, wherein the clamping unit includes a switching device that is configured to be activated in response to the control signal, connecting the at least one bit line and the sensing line.

9. The semiconductor device of claim 8, wherein the connection control unit is configured to connect the at least one bit line and the sensing line in the precharge period, and the at least one bit line is precharged to a second precharge voltage corresponding to a difference between the first voltage level and a threshold voltage of the switching device.

10. The semiconductor device of claim 8, wherein the connection control unit is configured to connect the at least one bit line and the sensing line if the voltage level of the at least one bit line is less than a difference between the second voltage level and the threshold voltage of the switching device in the develop period.

11. The semiconductor device of claim 10, wherein the sensing unit is configured such that, if the at least one bit line and the sensing line are connected, a voltage level of the sensing line is decreased to the voltage level of the at least one bit line, and
   wherein the sense amplifying unit senses the at least one memory cell as an ON cell.

12. The semiconductor device of claim 8, wherein the connection control unit configured such that, if the voltage level of the at least one bit line is greater than a difference between the second voltage level and the threshold voltage of the switching device in the develop period, the connection control unit does not connect the at least one bit line and the sensing line.

13. The semiconductor device of claim 12, wherein, the sensing unit is configured such that, when the at least one bit line and the sensing line are not connected, a voltage level of the sensing line is maintained at the first precharge voltage, and
   wherein the sense amplifying unit senses the at least one memory cell as an OFF cell.

14. The semiconductor device of claim 8, wherein the connection control unit further includes at least two discharge devices each connected to terminals of the switching device, and the two discharge devices are configured to discharge a voltage of the at least one bit line and the voltage of the sensing line in a discharge period in which a discharge enable signal is activated.

15. The semiconductor device of claim 8, wherein the connection control unit further includes:
   a temperature sensing unit configured to sense a temperature variation of a surrounding temperature of the semiconductor device; and
   a control signal providing unit configured to adjust a voltage level of the control signal according to the sensed temperature variation so as to compensate for the a variation of a threshold voltage of the switching device according to the variation of the surrounding temperature, and configured to provide the switching device with the control signal having the adjusted voltage level.

16. The semiconductor device of claim 1, wherein the semiconductor device is configured to sense data stored in the at least one memory cell without using a reference current provided by a reference cell.

17. A method of sensing data stored in at least one memory cell in a semiconductor device comprising the at least one memory cell disposed in a region at which at least one bit line and at least one word line, the method comprising:
   controlling a connection between the at least one bit line and a sensing line based on a control signal, the control signal having a voltage level that varies based on a value of data being sensed by the sensing unit.

18. The method of claim 16, further comprising:
   precharging the at least one bit line according to a precharge enable signal; and
   generating a sensing result based on a voltage of the sensing line and a reference voltage.

19. The method of claim 18, wherein the control signal has a first voltage level in a precharge period in which the precharge enable signal is activated, and has a second voltage level less than the first voltage level in a develop period in which a develop enable signal is activated.

20. The method of claim 19, wherein the at least one memory cell is a multi-level cell (MLC) capable of storing multi-level data, and
   wherein the second voltage level corresponds to a level of data to be sensed from among the multi-level data.

21. The method of claim 19, wherein the precharging of the at least one bit line includes:
   precharging the sensing line to a first precharge voltage according to the precharge enable signal; and
   precharging the at least one bit line to a second precharge voltage by connecting the sensing line and the at least one bit line,
   wherein the second precharge voltage corresponds to a difference between the first voltage level and a threshold voltage.

22. The method of claim 19, wherein the controlling of the connection includes
   connecting the at least one bit line and the sensing line if the voltage level of the at least one bit line is less than a difference between the second voltage level and a threshold voltage in the develop period.

23. The method of claim 22, wherein, if the at least one bit line and the sensing line are connected, a voltage level of the sensing line is decreased to the voltage level of the at least one bit line, and
   wherein the at least one memory cell is sensed as an ON cell.

24. The method of claim 19, wherein the controlling of the connection includes preventing the connection of the at least one bit line and the sensing line if the voltage level of the at least one bit line is greater than a difference between the second voltage level and a threshold voltage in the develop period.

25. The method of claim 24, wherein, if the at least one bit line and the sensing line are not connected, a voltage level of the sensing line is not decreased to the voltage level of the at least one bit line, and
   wherein the at least one memory cell is sensed as an OFF cell.

26. The method of claim 17, further comprising discharging a voltage of the at least one bit line and the voltage of the sensing line in a discharge period in which a discharge enable signal is activated.

27. The method of claim 17, further comprising:
   sensing a temperature variation of the semiconductor device;
   adjusting a voltage level of the control signal according to the sensed temperature variation; and
   providing the control signal having the adjusted voltage level.

* * * * *